(12) United States Patent
Esumi et al.

(10) Patent No.: US 7,783,950 B2
(45) Date of Patent: Aug. 24, 2010

(54) DATA WRITING APPARATUS AND A STORAGE SYSTEM

(75) Inventors: Atsushi Esumi, Kyoto (JP); Hidemichi Mizuno, Musashimurayama (JP)

(73) Assignee: ROHM Co., Ltd. (JP)

( * ) Notice: Subject to any disclaimer, the term of this patent is extended or adjusted under 35 U.S.C. 154(b) by 1003 days.

(21) Appl. No.: 11/524,130

(22) Filed: Sep. 20, 2006

(65) Prior Publication Data

US 2007/0162838 A1 Jul. 12, 2007

(30) Foreign Application Priority Data

Sep. 22, 2005 (JP) .............................. 2005-276921

(51) Int. Cl.
*H03M 13/00* (2006.01)
(52) U.S. Cl. ........................... 714/752; 360/46; 360/51; 360/65
(58) Field of Classification Search ................. 714/752; 360/46, 51, 65
See application file for complete search history.

(56) References Cited

U.S. PATENT DOCUMENTS 5,239,640 A * 8/1993 Froemke et al. ................ 714/1
7,072,417 B1 * 7/2006 Burd et al. ................... 375/295

FOREIGN PATENT DOCUMENTS

| JP | 63-207221 | 8/1988 |
| JP | 10-340596 | 12/1998 |
| JP | 2002-164794 | 6/2002 |

OTHER PUBLICATIONS

Japanese Office Action for Japanese Patent Application No. 2005-276921 dated Sep. 30, 2008 with English Translation.
Japanese Office Action for Patent Application No. 2005-276921 dated Dec. 24, 2008 with an English Translation.
Bane Vasic et al., "Coding and Signal Processing for Magnetic Recording Systems", U.S. CRC Press LLC, Nov. 2004, pp. 16-16 and 16-17.
Japanese Office Action for Patent Application No. 2005-276921 dated Jun. 24, 2008; with English translation.
"Application of Low Density Parity Check Code and Iterative Decoding to Magnetic Recording System"; Esumi et al. IEICE Technical Report, Japan Dec. 2002, vol. 102, No. 499, p. 13-18; with English Abstract.

* cited by examiner

*Primary Examiner*—Sam Rizk
(74) *Attorney, Agent, or Firm*—Cantor Colburn LLP (57) ABSTRACT

An LDPC encoder (304) includes a timing adjustment circuit (326) for performing timing adjustment on main data and outputting to a writing circuit (334), a parity generation circuit (328) for performing LDPC encoding on input signal series, generating the parity data, and outputting to the writing circuit (334), and the writing circuit (334) for sequentially receiving the main data and the parity data, and outputting to the storage apparatus via a write pre-compensation unit (305), a driver (306), and the like.

10 Claims, 6 Drawing Sheets

DATA WRITING APPARATUS AND A STORAGE SYSTEM

BACKGROUND OF THE INVENTION

1. Field of the Invention

The present invention relates to technology for accessing storage media, and in particular, to a data writing apparatus and a storage system.

2. Description of the Related Art

In recent years, storage apparatuses using hard disks are becoming essential in various fields, such as those of personal computers, hard disk recorders, video cameras, mobile telephones, and the like. Various specifications are required for the storage apparatuses that use hard disks, according to fields of application; for example, when used in personal computers, high speed and large capacity are required. However, since the quantity of data increases as capacity is enlarged, adequate error correction ability becomes necessary, and it becomes difficult to realize high speed.

Conventionally, turbo encoding, low density parity check encoding, and the like, are used as error correction methods employed in storage apparatuses using hard disks. These error correction methods carry out prescribed processing on data that is an object of error correction encoding, generate parity data, and, on a decoding side, perform a check as to whether or not there is an error, using the parity data, and correct the error. Accordingly, it is necessary that the data and the parity data be linked and written to the storage apparatus. However, since the data and the parity data are generated on separate paths, it is difficult to write the two types of data to the storage apparatus at high speed, while having both of the data types perform a handshake. Furthermore, there are problems in that circuits become complicated and cost becomes high. As a method of improving these problems, there is a method in which parity bits are outputted using vacant time of the data paths after completion of a writing cycle to the storage apparatus. (For example, refer to Patent Document 1).

Patent Document 1: Japanese Patent Application, Laid Open No. 10-340596

However, in general, it is difficult to range in order the data and the parity data, while writing the data that is an object of error correction encoding and the parity data at high speed to the storage apparatus.

SUMMARY OF THE INVENTION

The present invention has been made taking this situation into account and an overall objective thereof is to provide a storage apparatus in which access can be carried out at higher speeds.

In order to solve the above problems, in an aspect of the present invention, a data writing apparatus is provided, being an apparatus for writing main data and parity data used for error correction of the main data, to a storage apparatus, comprising: a writing circuit for writing the main data and the parity data to the storage apparatus; a parity generation circuit for generating the parity data in parallel with the writing of the main data; and a timing adjustment circuit for performing adjustment so that a head of the generated parity data appears after a tail-end of the main data, consecutively, as regards timing of writing; wherein the main data and the parity data, whose timing is adjusted by the timing adjustment circuit, are provided to the writing circuit.

According to this aspect, by adjusting the timing of writing of the main data and the parity data, the main data and the parity data can be written to the storage apparatus in a state in which both are not separated but are linked.

Here, "generating parity data in parallel with the writing of the main data" includes the fact that a writing process of the main data takes place simultaneously with a generation process of the parity data, and that a part of processing time of one of either of the processes overlaps with apart of processing time of the other process. Furthermore, "performing adjustment so that a head of the parity data appears after a tail-end of the main data, consecutively, as regards timing of writing" includes the fact that timing is adjusted so that the head of the parity data is written immediately after the tail-end of the main data is written. Moreover, the "data writing apparatus" may, for example, include a circuit for implementing error correction encoding on the main data, and generating the parity data, and may include a circuit for performing adjustment of the timing of the main data, a circuit for generating the main data, and, otherwise, a circuit for implementing prescribed processing on the main data and generating data for writing to the storage apparatus.

A parity generation circuit may be provided with an interleaving circuit for sorting an order of the main data in accordance with a prescribed rule; a low density parity check encoding circuit for performing low density parity check encoding on the data sorted by the interleaving circuit, and generating encoded data; and a de-interleaving circuit for returning an order of the encoded data generated by the low density parity check encoding circuit to an original form, and outputting the parity data.

In addition, the timing adjustment circuit may be arranged in a propagation path of the main data so as to cancel out delay time in the parity generation circuit. The timing adjustment circuit may delay the main data, with, as a delay amount, a value obtained by subtracting, from time required for generation of the parity data in the parity generation circuit, time required for supplying data from the head to the tail-end of the main data, to the writing circuit. Furthermore, the timing adjustment circuit may have a number of delay elements, the number corresponding to the delay amount, and the delay elements may delay the main data inputted to the delay elements, and output the main data. According to this type of configuration, since the delay amount can be fixed, it is possible to reduce hardware size of the writing apparatus.

Furthermore, the timing adjustment circuit may be provided with a delay amount determining unit for determining the delay amount, and a plurality of delay elements to which the main data is inputted, given a delay, and outputted. Based on the delay amount determined by the delay amount determining unit, any delay element among the plurality of delay elements is selected, and the main data may be outputted from the selected element to the writing circuit. Moreover, the plurality of delay elements may have at least a larger delay amount than the delay amount in question. By having this type of configuration, even in cases in which the number of items in the main data is variable, the delay amount can be changed adaptively.

Moreover, the data writing apparatus may additionally have the delay amount determining unit for generating the delay amount and supplying the delay amount to the timing adjustment circuit. The timing adjustment circuit may use the delay amount supplied from the delay amount determining unit to delay and output the main data inputted to the timing adjustment circuit. Furthermore, the storage apparatus may be a magnetic storage apparatus built-in in a computer; the parity generation circuit may generate the parity data for the main data generated inside the computer; and the writing circuit may write the main data and the parity data sequentially to the magnetic storage apparatus. Moreover, the data writing apparatus may be integrated on one semiconductor board.

According to this aspect, by arranging the timing adjustment circuit in a processing path of the main data, load on the parity generation circuit can be lessened, and writing time to the storage apparatus can be shortened. Furthermore, with a value for which time required for generating the parity data is considered, by delaying the main data, the main data and the parity data can be written to the storage apparatus with good timing. In addition, by arranging a number of the delay elements, the number corresponding to the delay amount, timing adjustment can be performed autonomously, without the need for a software-type of handshake control. Since it is not necessary to install extra hardware, a small sized semiconductor integrated circuit can be realized.

Here, "to cancel out delay time in the parity generation circuit" includes the fact that the timing adjustment circuit adjusts the timing, giving consideration to processing time for the parity generation circuit.

Another aspect of the present invention concerns a storage system. The storage system comprises a signal storage system having a write channel for writing data to a storage apparatus, and a read channel for reading data stored in the storage apparatus, wherein the write channel comprises a first encoder for run-length encoding of data; a second encoder for encoding data encoded by the first encoder, using a low density parity check code; and a data writing unit for writing the data encoded by the second encoder, to the storage apparatus; the read channel comprises a data reading unit for reading the data stored in the storage apparatus; a soft output detection unit for calculating likelihood for the data read by the data reading unit, and for outputting a soft decision value; a first decoder corresponding to the second encoder, for decoding data outputted from the soft output detection unit; and a second decoder, corresponding to the first encoder, for decoding the data decoded by the first decoder; and the data writing unit comprises a writing circuit for writing parity data and data encoded by the first encoder to the storage apparatus; a parity generation circuit for generating the parity data in parallel with writing the data encoded by the first encoder; and a timing adjustment circuit for performing an adjustment so that a head of the generated parity data appears after a tail-end of the main data, consecutively, as regards timing of writing; wherein the main data and the parity data, whose timing is adjusted by the timing adjustment circuit, are provided to the writing circuit. Furthermore, the storage system may be integrated on one semiconductor board.

According to this aspect, by providing the timing adjustment circuit, the main data and the parity data can be accurately linked. Moreover, access control to the storage system can be realized at a higher speed.

Furthermore, optional combinations of the above component elements, with the component elements and representation of the present invention interchanged as regards methods, apparatuses, system, and the like, are also valid embodiments of the present invention.

DETAILED DESCRIPTION OF THE INVENTION

The invention will now be described by reference to the preferred embodiments. This does not intend to limit the scope of the present invention, but to exemplify the invention.

Below, an explanation concerning embodiments of the present invention (referred to as "embodiments" below) will be given, making reference to the drawings.

Embodiments

Before giving a specific explanation of the embodiments of the present invention, first an outline of a storage apparatus related to the present embodiment will be described. The storage apparatus related to the present embodiment has a hard disk controller, a magnetic disk device, and a read-write channel including a read channel and a write channel. Furthermore, the write channel has a parity generation circuit, a timing adjustment circuit, and a writing circuit. With regard to the write channel, processing is carried out to generate parity data in the parity generation circuit, and to write the parity data with main data to the storage apparatus via a writing circuit.

Here, the following several methods may be considered for adjustment of timing by the timing adjustment circuit. As one method, memory is provided inside the data writing circuit, and the main data is temporarily held in this memory until the parity data reaches the data writing circuit. Furthermore, at the occasion when the head of the parity data reaches the data writing circuit, output of the main data from the memory inside the writing circuit may be started. As a second method, after writing the tail-end of the main data via the writing circuit, writing permission is disallowed until the head of the parity data is inputted to the writing circuit. Concerning writing permission in this case, whether or not to allow writing to the storage apparatus is judged by hardware or software processing (referred to below as a "handshake"), and there is a control flag for switching between allowing and disallowing writing. For example, on an occasion of when the head of the parity data is inputted to the writing circuit, the handshake is performed, reversing the control flag from disallowed to allowed, or the like.

In cases of either of the abovementioned two methods of timing adjustment, the main data and the parity data can be written to the storage apparatus in a state in which they are consecutive. However, in the first method, since the capacity of the memory inside the writing circuit requires only the data amount of the main data, if applied to a large capacity storage apparatus, hardware size becomes large. In addition, in the second method, since the handshake is required in the flag switching control, the method is not suitable for a storage apparatus in which high speed is desired.

Therefore, in the embodiment of the present invention, in consideration of processing time for parity data generation by the parity generation circuit, a method of delaying the main data is adopted. While the parity data is being generated by the parity generation circuit, timing for the main data is adjusted by the timing adjustment circuit, and after that, the main data is inputted to the writing circuit, details of which are described below. In addition, the parity data generated by the parity generation circuit is input to the writing circuit. At this time, in consideration of processing time for the parity generation circuit, the timing adjustment circuit delays the main data. Therefore, after the tail-end of the main data, the head of the parity data is inputted to the writing circuit. As a result, a gap is not generated between the main data and the parity data, and both are written in a linked state to the storage apparatus via the writing circuit. By having this type of embodiment, even if the storage apparatus has a large capacity, the size of the hardware does not become large, and it is possible to provide the storage apparatus in which effects on speeding up can be reduced.

Here, the "storage apparatus" may, for example, be a hard disk built-in in a computer, a digital video player, a mobile telephone, or the like, or may be an apparatus in which write processing is carried out on accumulation media such as a digital video disk, or the like. Furthermore, the "main data" is not limited to data that is an object to which error correction encoding is applied, and may, for example, be image data, voice data, and the like. In addition, the "main data" may be data resulting from application of prescribed compression encoding of the image data and the voice data. Moreover, the "parity data" may be a parity bit series including redundant data related to the main data or redundant code, and may include, for example, results of error correction encoding such as turbo encoding, low density parity check encoding (abbreviated below to LDPC encoding), and the like, and encoding generated as organized code or non-organized code. Furthermore, in cases of a plurality of parity bit series generated as a result of error correction encoding, at least one parity bit series is also possible.

In general, a generated matrix for LDPC encoding or LDPC decoding is described as G, and a check matrix as H. Here, in order to simplify the explanation, both are explained as a prescribed matrix, or the matrix H. Moreover, since the generated matrix G has a relationship according to Equation (1) with the check matrix H, if one matrix is decided then the other is also decided.

$$G \times H^T = 0 \quad \text{Equation (1)}$$

Here, $H^T$ is a transposed matrix of H. Furthermore, 0 on the right hand side indicates a zero matrix.

In addition, in order to simplify the explanation below, "storage" and "recording" are unified as "storage" in the description. In the same way, "to store" and "to record" are unified as "to store" in the description. Below, a detailed explanation is given concerning the embodiment of the present invention, using the drawings.

Figure 1:
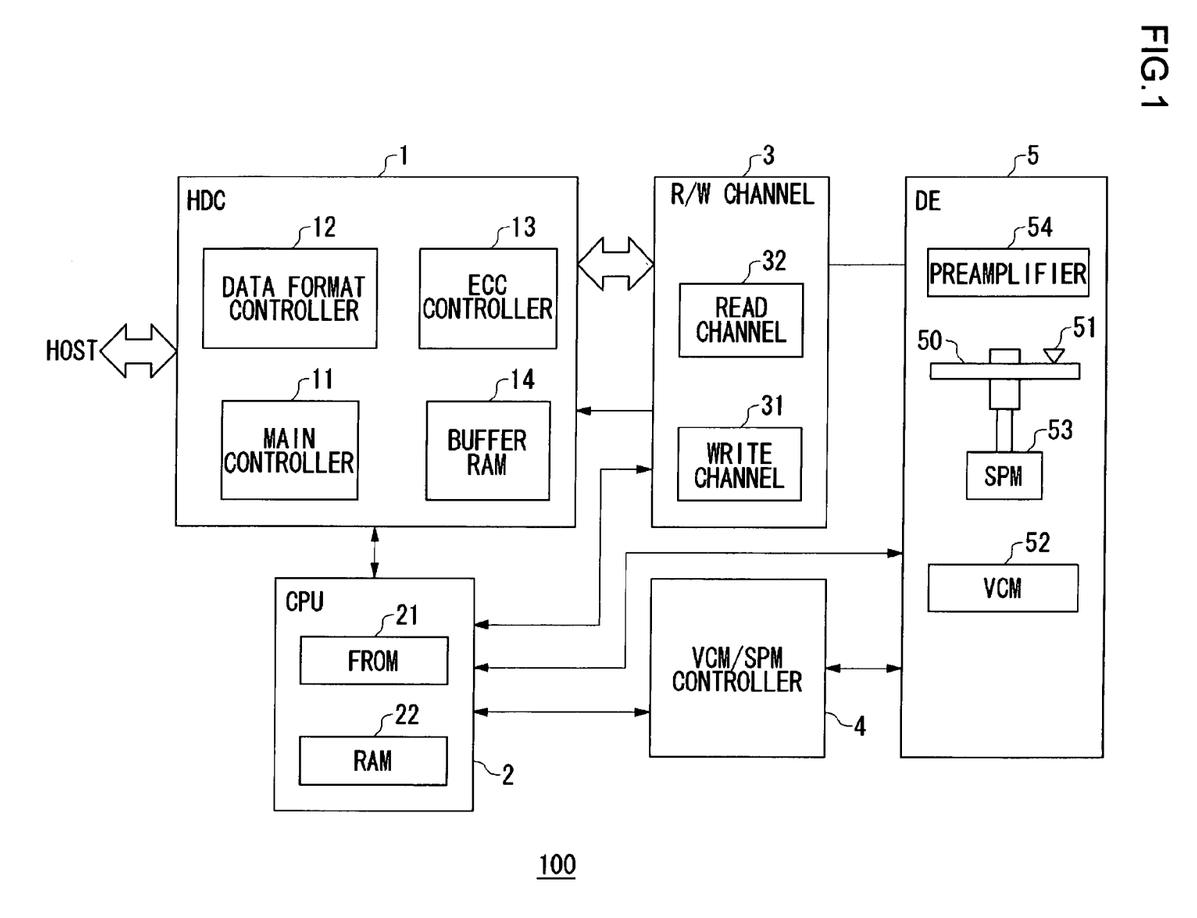
FIG. 1 is a view showing a configuration example of a magnetic disk apparatus related to an embodiment of the present invention.

FIG. 1 is a view showing a configuration example of a magnetic disk apparatus 100 related to a first embodiment of the present invention. The magnetic disk apparatus 100 of FIG. 1 includes a hard disk controller 1 (below, abbreviated to HDC 1), a central processing unit 2 (below, abbreviated to CPU 2), a read-write channel 3 (below, abbreviated to R/W channel 3), a voice coil motor/spindle motor controller 4 (below, abbreviated to VCM/SPM controller 4), and a disk enclosure 5 (below, abbreviated to DE 5). In general, the HDC 1, the CPU 2, the R/W channel 3, and the VCM/SPM controller 4 are configured on a same board.

The HDC 1 includes a main controller 11 for controlling the whole HDC 1, a data format controller 12, an error correction encoding controller 13 (below, abbreviated to ECC controller 13), and a buffer RAM 14. The HCD 1 is connected to a host system via an interface unit, not shown in the figure, and, in addition, is connected to the DE 5, via the R/W channel 3, and transfers data between the host and the DE 5, by control of the main controller 11. A read reference clock (RRCK) generated by the R/W channel 3 is input to this HDC 1. The data format controller 12 converts data transferred from the host into a format suitable for storing on the disk media 50, and conversely, converts data reproduced from the disk media 50 into a format suitable for transferring to the host. The disk media 50 includes, for example, a magnetic disk. In order to enable correction and detection of errors included in the data reproduced from the disk media 50, the ECC controller 13 adds redundant symbols, with stored data as information symbols. Furthermore, the ECC controller 13 judges whether an error has occurred in the reproduced data, and when there is an error, correction or detection is carried out. However, the number of symbols that can correct errors is limited, and is related to length of the redundant data. More specifically, since formatting efficiency deteriorates if much redundant data is added, there is a trade-off with the number of possible symbols for error correction. In cases in which Reed-Solomon (RS) code is used as the ECC to perform error correction, up to ((number of redundant symbols)/2) errors can be corrected. The buffer RAM 14 temporarily stores data transferred from the host, and transfers the data with suitable timing to the R/W channel 3; and conversely, temporarily stores read data transferred from the R/W channel 3, and after completion of the ECC decoding processing, transfers the data with suitable timing to the host.

The CPU 2 includes a flash ROM 21 (below, abbreviated to FROM 21), and a RAM 22, and is connected to the HDC 1, the R/W channel 3, the VCM/SPM controller 4, and the DE 5. An operational program of the CPU 2 is stored in the FROM 21.

The R/W channel 3 includes a write channel 31 and a read channel 32, and performs transfer of stored data and reproduced data with the HDC 1. Furthermore, the R/W channel 3 is connected to the DE 5, and performs transmission of stored signals and receipt of reproduced signals. Details are described below.

The VCM/SPM controller 4 controls a voice coil motor 52 (below, abbreviated to VCM 52) inside the DE 5, and a spindle motor 53 (below, SPM 53).

The DE 5 is connected to the R/W channel 3, and performs reception of a stored signal and transmission of a reproduced signal. Furthermore, the DE 5 is connected to the VCM/SPM controller 4. The DE 5 includes the disk media 50, a head 51, the VCM 52, the SPM 53, and a preamplifier 54. In the magnetic disk apparatus 100 of FIG. 1, it is assumed that there is one of the disk media 50, and that the head 51 is arranged on one side only of the disk media 50; however, the configuration may also have a plurality of disk media 50 arranged in a stack. Moreover, in general, the head 51 is arranged to correspond to each side of the disk media 50. The stored signal transmitted by the R/W channel 3 is supplied via the preamplifier 54 inside the DE 5 to the head 51, and is stored on the disk media 50 by the head 51. Conversely, a signal reproduced from the disk media 50 by the head 51 is transmitted via the preamplifier 54 to the R/W channel 3. In order to position the head 51 at a target position on the disk media 50, the VCM 52 inside the DE 5 moves the head 51 in a radial direction of the disk media 50. In addition, the SPM 53 rotates the disk media 50.

Figure 2:
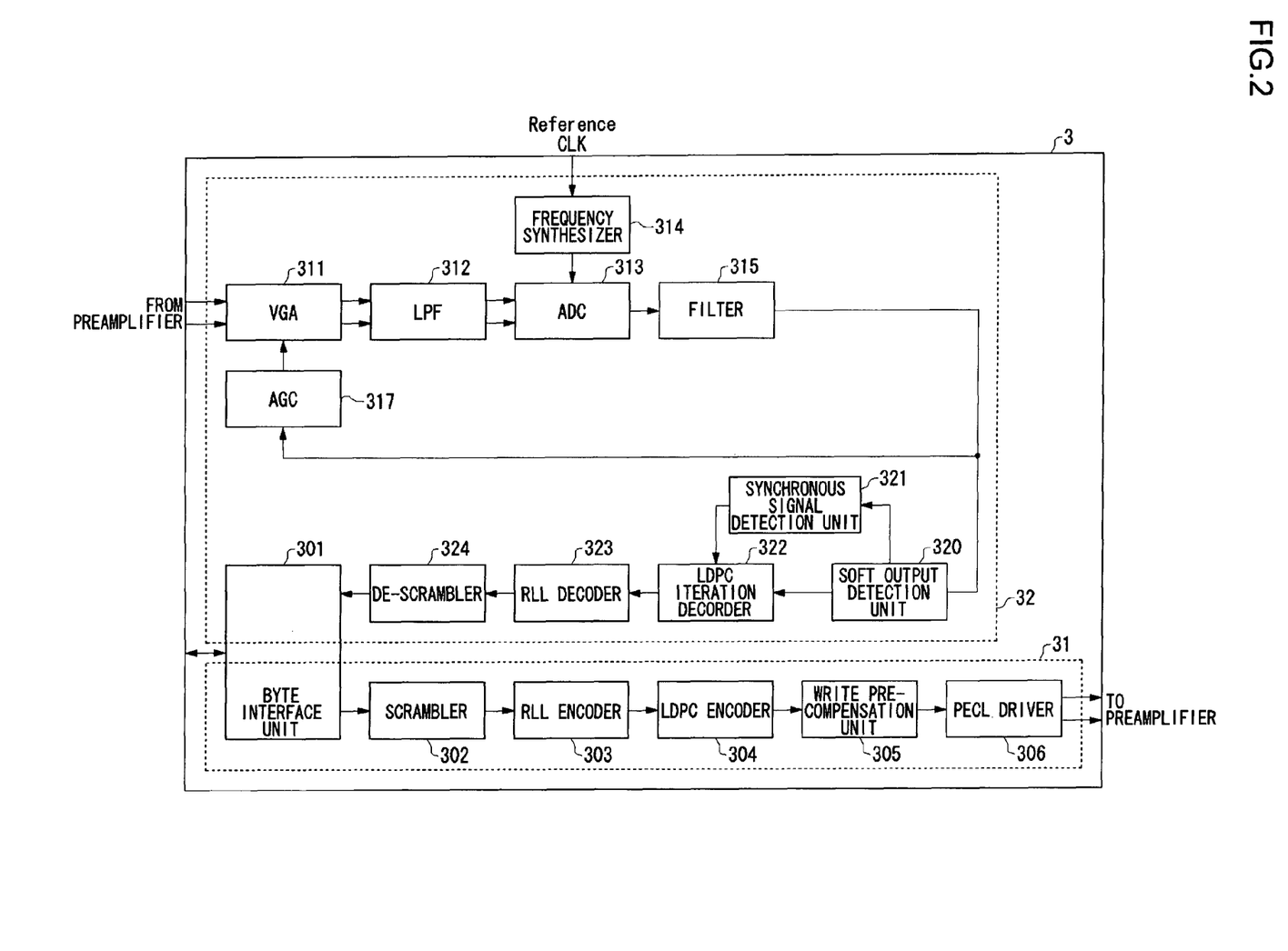
FIG. 2. is a view of a configuration example of a read/write channel of FIG. 1.

Here, the R/W channel 3 is explained, using FIG. 2. FIG. 2 shows a configuration example of the R/W channel 3 of FIG. 1. The R/W channel 3 includes a write channel 31 and a read channel 32.

The write channel 31 includes a byte interface unit 301, a scrambler 302, a run-length control encoder 303 (below, abbreviated to RLL encoder 303), a low density parity check encoder 304 (below, abbreviated to LDPC encoder 304), a write compensation unit 305 (below, described as a write pre-compensation unit 305), and a driver 306.

The byte interface unit 301 processes, as input data, data transmitted from the HDC 1. Data to be written on the media is input from the HDC 1 in one sector units. At this time, not only user data for one sector (512 bytes), but also ECC bytes added by the HDC 1 are inputted at the same time. A data bus is usually one byte (8 bits), and processing is carried out for data input by the byte interface unit 301. The scrambler 302 converts write data into a random series. This is to prevent iteration of the same data rule that adversely affects detection performance at read time and causes deterioration in error rate. The RLL encoder 303 has a role of limiting the maximum continuous length of 0s. By limiting the maximum continuous length of 0s, a data series is formed that is suitable for an automatic gain control unit 317 (below, abbreviated to AGC 317) or the like, at read time.

The LDPC encoder 304 has a role of LDPC-encoding the data series, to generate a series including parity bits that are redundant bits. The LDPC encoding is performed by multiplying, from the left, a data series of length k, by a k×n matrix called a generated matrix. Each element included in the check matrix H corresponding to this generated matrix is 0 or 1, and since the number of is 1s low in comparison to the number of 0s, it is called Low Density Parity Check Code. By using this arrangement of 1s and 0s, correction of errors can be performed efficiently in the LDPC iteration decoder 322, described below. Details are given below.

The write pre-compensation unit 305 is a circuit for compensating for non-linear distortion due to continuous magnetic transition on the media. A rule necessary for compensation is detected from the write data, and a write electrical current waveform is adjusted in advance so that the magnetic transition occurs at a correct position. The driver 306 is a driver for outputting a signal corresponding to a pseudo ECL level. Output from the driver 306 is sent to the DE 5, not illustrated in the figure, and sent through the preamplifier 54 to the head 51, and the write data is stored on the disk media 50.

The read channel 32 is configured from a variable gain amplifier 311 (below, abbreviated to VGA 311), a low-pass filter 312 (below, abbreviated to LPF 312), the AGC 317, a analog/digital converter 313 (below, abbreviated to ADC 313), a frequency synthesizer 314, a filter 315, a soft output detection unit 320, an LDPC iteration decoder 322, a synchronous signal detector 321, a run-length control decoder 323 (below, abbreviated to RLL decoder 323), and a descrambler 324.

The VGA 311 and the AGC 317 perform adjustment of the amplitude of a read waveform of data send from the preamplifier 54, not shown in the figure. The AGC 317 compares the actual amplitude with an ideal amplitude, and determines gain to be set in the VGA 311. The LPF 312 can adjust cutoff frequency and boost amount, and handles part of equalization of partial response waveform (below, abbreviated to PR) and reduction of high frequency wave noise. In the LPF 312, equalization of the PR waveform is carried out, but complete equalization by analog LPF is difficult due to many causes, such as variation in amount by which the head rises, non-uniformity of media, variation in rotation of motor, and the like, and the filter 315, disposed at a rear stage and having more flexibility, is used, and performs equalization of the PR waveform again. The filter 315 has a function of adaptively adjusting a tap coefficient thereof. The frequency synthesizer 314 generates a sampling clock for the ADC 313. The ADC 313 has a configuration to obtain a direct synchronous sample by AD conversion. In addition to this configuration, the configuration may obtain an asynchronous sample by the AD conversion. In such cases, a zero phase restart unit, a timing controller, and an interpolation filter may be further arranged at the rear stage of the ADC 313. It is necessary to obtain a synchronous sample from the non-synchronous sample, and these blocks have a role of doing this. The zero phase restart unit is a block for determining an initial phase, and is used to obtain the synchronous sample as early as possible. After deciding the initial phase, an actual sample value and an ideal sample value are compared by a timing controller, and phase lag is detected. By using this to decide a parameter of the interpolation filter, the synchronous sample can be obtained.

The soft output detection unit 320 uses a soft output Viterbi Algorithm (abbreviated to "SOVA" below) to avoid deterioration of decoding characteristic that accompanies inter-symbol interference. That is, with the increase in storing density of magnetic disk apparatuses in recent years, interference between stored code has increased, and in order to solve the problem of deterioration of decoding characteristic, a maximum-likelihood decoding (Partial Response Maximum Likelihood; abbreviated to PRML below) system, using partial response due to interference between code, is used as a system to overcome this. The PRML is a system for obtaining a signal series that maximizes likelihood of a partial response of reproduced signals.

The soft output detection unit 320 is composed of a SOVA or the like, and outputs a soft decision value. For example, a soft decision value of (0.71, 0.18, 0.45, 0.45, 0.9) is outputted as output of the SOVA. These are numerical values that express whether the probability of 0 is large, and whether the probability of 1 is large. For example, the first value of 0.71 indicates that the probability of 1 is large, and the fourth value of 0.45 means that the probability of 0 is large but the probability of 1 is also not small. Output of a conventional Viterbi detector is a hard decision value, and is a hard decision of the SOVA output. In the case of the abovementioned example, this is (1, 0, 0, 0, 1). The hard decision value is only expressed as being 0, or as being 1, and information indicating which has a higher probability is lost. As a result, with input of the soft decision value to the LDPC iteration decoder 322, decoding performance improves.

The LDPC iteration decoder 322 has a role of restoring from the data series that is LDPC-encoded, to a series before the LDPC encoding. Methods of decoding include, principally, a sum-product decoding method, and a min-sum decoding method; from the view of decoding performance, the sum-product decoding method is advantageous, but the min-sum decoding method has a characteristic in that it can be realized easily by hardware. In actual decoding operations using LDPC encoding, by performing iteration decoding between the soft output detection unit 320 and the LDPC iteration decoder 322, very good decoding performance can be obtained. Therefore, in actuality, a configuration is necessary in which the soft output detection unit 320 and the LDPC iteration decoder 322 are arrayed in a plurality of stages.

The LDPC iteration decoder 322 performs interleave processing on a signal series outputted from the soft output detection unit 320, carries out LDPC decoding processing, and in addition, carries out reverse interleave processing. Furthermore, a check is carried out as to whether an error has been corrected by the LDPC decoding, and judges whether to perform iteration processing again. In cases in which iteration decoding is carried out, a soft decision value is again computed, and feedback given to a forward stage of the interleave processing.

Specifically, the LDPC iteration decoder 322 uses a prescribed sorting rule to perform sort processing on data outputted from the soft output detection unit 320. Since specific operations are the same as for the first interleaver 330, described below, an explanation here is omitted. Furthermore, using the matrix H, a priori probability and a posteriori probability of the sorted data series is obtained, and a soft decision value, that is a decoding result, is computed. In addition, using a prescribed sorting rule, the computed soft decision value is used to perform reverse sort processing to return the previously sorted series to an original form. Since specific operations are the same as for the first de-interleaver 332, an explanation here is omitted. In this way, by sorting places at which errors are concentrated, it is possible to disperse signals that include errors. Moreover, it is possible to improve error correction ability when decoding.

The synchronous signal detection unit 321 detects a synchronous signal (sync mark) added to the head of the data, and has a role of recognizing the head position of the data. The RLL decoder 323 performs an operation the reverse of the RLL encoder 303 of the write channel 31, on data outputted from the LDPC iteration decoder 322, to return the original data series. The de-scrambler 324 performs an operation the reverse of the scrambler 302 of the write channel 31, to return the original data series. The data generated here is transmitted to the HDC 1.

Figure 3:
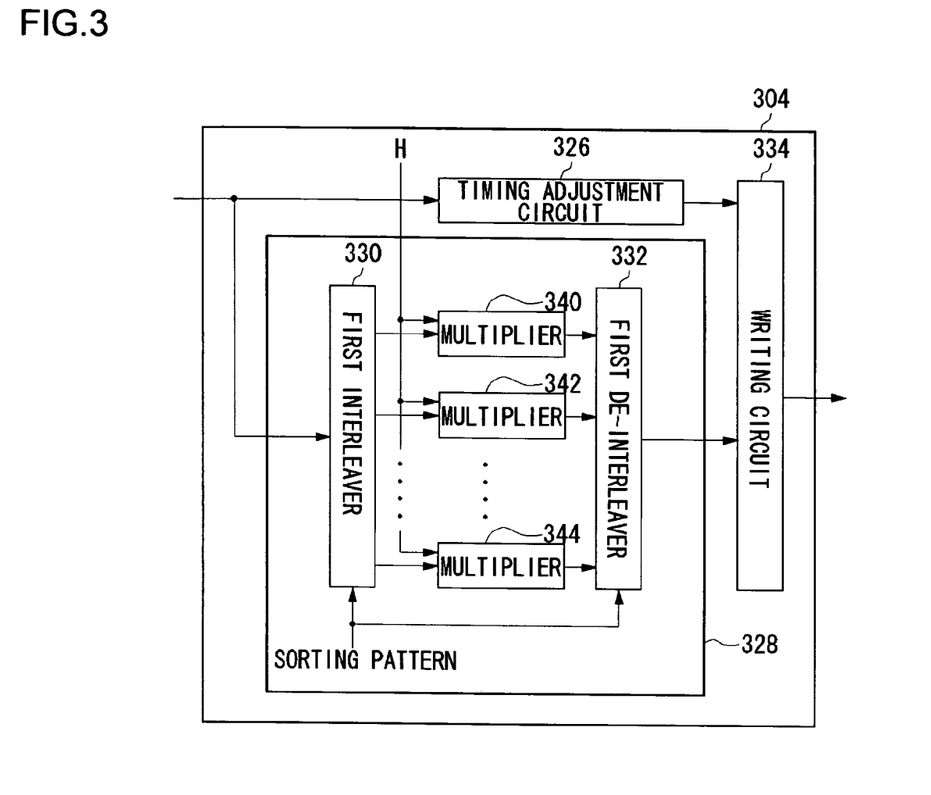
FIG. 3. is a view showing a configuration example of an LDPC encoder of FIG. 2.

A detailed explanation is given here concerning the LDPC encoder 304. FIG. 3 is a view showing a configuration example of the LDPC encoder 304 of FIG. 2. The LDPC encoder 304 includes the timing adjustment circuit 326 for performing timing adjustment on the main data and outputting to the writing circuit 334, the parity generation circuit 328 for performing LDPC encoding on the input signal series, generating the parity data, and outputting to the writing circuit 334, and the writing circuit 334 for sequentially receiving the main data and the parity data and outputting to the storage apparatus via the write pre-compensation unit 305, the driver 306, and the like.

The timing adjustment circuit 326 is a circuit for adjusting timing of the main data that is inputted, and for outputting the main data that has been given a delay. This timing adjustment is performed with consideration given to time required for generating parity data in the parity generation circuit 328. In other words, the timing of the main data is adjusted so as to cancel out the delay time in the parity generation circuit 328. In this way, the head of the generated parity data appears after the tail-end of the main data, consecutively as regards timing of writing, in the writing circuit 334, and output timing of the main data to the writing circuit 334 can be adjusted. Here, the reason for arranging the timing adjustment circuit 326 in the processing path of the main data is because the time required for all the data included in the main data to be inputted to the writing circuit 334 is shorter than the time required for generating the parity data in the parity generation circuit 328. As a result, if the timing of the main data is not adjusted, a state in which the main data is linked with the parity data cannot be realized. Moreover, details of a specific embodiment in which the timing of the main data is adjusted are described below.

The parity generation circuit 328 includes a first interleaver 330 for performing interleaving processing on the input signal sequence, multipliers 340 to 344 (referred to representatively below as "multipliers 340") for multiplying each of the signal series that are interleaved by the H matrix, and a first de-interleaver 332 for performing sort processing the reverse of the first interleaver 330 and for generating parity bits. The parity generation circuit 328 is a circuit for carrying out LDPC encoding on the main data and outputting to the writing circuit 334. The parity generation circuit 328 generates the parity data in parallel, time-wise, with delay processing of the main data by the timing adjustment circuit 326 and/or write processing to the storage apparatus via the writing circuit 334 and the like.

The first interleaver 330 sorts the signal series that have been inputted into a plurality of series, and outputs these respectively to the multiplier 340. This sorting is done according to a sorting rule (interleaving pattern) inputted from the outside, and the number of processing paths. For example, where the sorting rule is (0, 1, 2, 3, 4, 5, 6, 7), and the signal series are inputted in the an order d0, d1 to d7, the signal series are sorted as in Equation (2).

$$(d0, d1, d2, d3, d4, d5, d6, d7) \quad \text{Equation (2)}$$

Here, in cases in which the number of processing paths is two, that is, the number of multipliers 340 is two (the multiplier 340 and the multiplier 342), output is as follows:

Input series of multiplier 340: (d0, d2, d4, d6)

Input series of multiplier 342: (d1, d3, d5, d7)

That is, the signals shown in Equation (2) are input to the same multiplier every second one, two being the number of multipliers.

Another example is now explained. For example, in cases where the sorting rule is (0, 4, 1, 5, 2, 6, 3, 7), and the signal series are inputted in the order of d0, d1 to d8, the signal series are sorted as in Equation (3).

$$(d0, d4, d1, d5, d2, d6, d3, d7) \quad \text{Equation (3)}$$

Here, in cases in which the number of processing paths is two, that is, the number of multipliers 340 is two, (the multiplier 340 and the multiplier 342), output is as follows:

Input series of multiplier 340: (d0, d1, d2, d3)

Input series of multiplier 342: (d4, d5, d6, d7)

That is, the signal series shown in Equation (3) are inputted to the same multiplier every second multiplier, two being the number of multipliers.

The multiplier 340 is provided at each processing path, and makes the matrix H, that is inputted from the outside, to act on signals outputted from the first interleaver 330, and perform a computation. Specifically, a computation expressed in Equation (4) is performed.

$$D_i \times H = C_i \quad \text{Equation (4)}$$

Here $D_i$ is a 1×k matrix, and describes the signal series inputted to the respective multipliers 340. Moreover, i is a positive integer, greater than or equal to 1 and less than or equal to M, and describes the number of processing paths. In addition, H is a k×n matrix. $C_i$ is an encoded series, and describes a 1×n matrix.

Next, an explanation is given concerning the first de-interleaver 332. The first de-interleaver 332 combines encoded series outputted from each of the multipliers 340, performs sort processing, and outputs parity series. This sort processing is performed using a sorting rule used by the first interleaver 330. However, even with the same sorting rule, the sort processing itself is different from the first interleaver 330. Specifically, if the sorting rule is (0, 1, 2, 3, 4, 5, 6, 7) and the series outputted from the multiplier 340 are, respectively, (d0, d2, d4, d6) and (d1, d3, d5, d7), the output series of the first de-interleaver 332 is (d0, d1, d2, d3, d4, d5, d6, d7). That is, the sorting can be done so that in cases where there is no multiplier 340, sort processing is not carried out. That is, the first de-interleaver 332 performs processing the reverse of the first interleaver 330. Here, the number of processing paths and the sorting rule are decided in consideration of the localization of the burst errors included in the signal series, or the linear dependency held by the matrix H, described below.

The writing circuit 334 performs processing to output sequentially to a rear stage of the circuit, the main data whose timing is adjusted by the timing adjustment circuit 326, and the parity data generated by the parity generation circuit 328. For example, if the main data is d0 to d100 and the parity data is p0 to p7, the output series of the writing circuit 334 is a series with d0 at the data head and p7 at the data end, as shown in Equation (5).

$$(d0, d1, \ldots d99, d100, p0, p1, \ldots p7) \qquad \text{Equation (5)}$$

Figure 4:
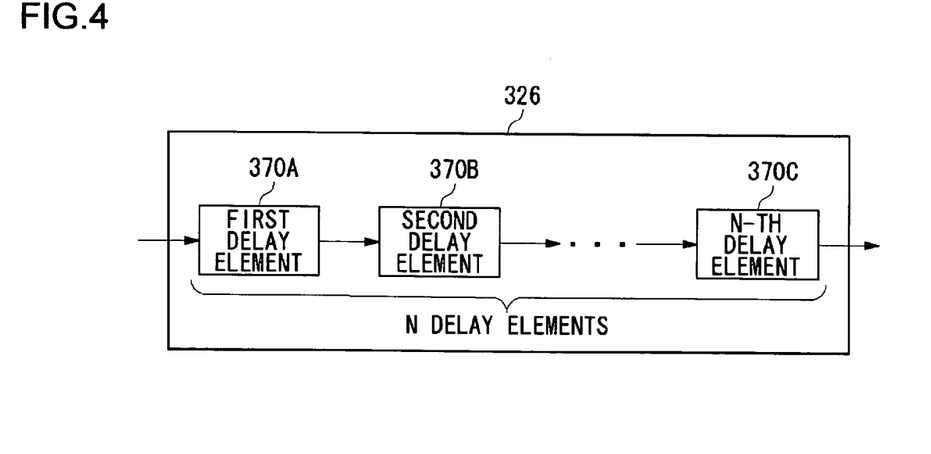
FIG. 4. is a view showing a first configuration example of a timing adjustment circuit of FIG. 3.

Here, a detailed explanation is given concerning the timing adjustment with respect to the timing adjustment circuit 326, using FIG. 4 to FIG. 7. FIG. 4 is a view showing a first configuration example of a timing adjustment circuit 326 of FIG. 3. The timing adjustment circuit 326 includes a first delay element 370A, a second delay element 370B, an N-th delay element 370C, and the like, representing delay elements 370. Here, the number of the delay elements 370 is N. Furthermore, N has a value the same as the delay amount. In other words, a delay unit 350 is provided with the delay elements 370, the number of which is the same as the delay amount computed in advance. The first configuration example of the timing adjustment circuit 326 shown in FIG. 4 computes in advance the delay amount as a fixed value, and adjusts the timing of the main data without going through any software processing. As a result, the configuration is such that the delay amount cannot be adaptably changed. However, in the error correction circuit such as that shown in FIG. 3, the number of items of data that are objects for performing error correction is usually decided in advance, and even if the timing is adjusted with a fixed delay amount as in the present modified example, a problem does not occur. In addition, by making the computation in advance, since hardware for computing the delay amount is not required, a decrease in the size of the hardware is realized.

Moreover, in the example of computation of the delay amount N, generation is carried out, giving consideration to the time required to generate the parity data in the parity generation circuit 328, so as to cancel out the delay time in the parity generation circuit 328 shown in FIG. 3. Specifically, for example, a value may be generated as the delay amount, that is obtained by subtracting the time required for supplying, to the writing circuit 334, data from the head of the main data to the tail-end, from the time required for generating the parity data in the parity generation circuit 328. The time required for generation the parity data in the parity generation circuit 328 is the processing time from when the head of the main data is input, in the abovementioned parity generation circuit 328, to when the head of the parity data is outputted. The time required for supplying, to the writing circuit 334, the data from the head to the tail-end of the main data, is the time from when the head of the main data is inputted to the timing adjustment circuit 326, to when the tail-end of the main data is inputted to the writing circuit 334. With regard to input processing of the main data to the timing adjustment circuit 326, delay processing in the delay unit 350, and input processing to the writing circuit 334, the time during which one item of data is processed is implemented with the same interval for all cases, that is, assuming all the processing takes place at the same rate, the time required for supplying the data from the head to the tail-end of the main data, to the writing circuit 334, is the length of the main data. The number of items of data and the delay amount have values which can be expressed in the same units, and the time for processing one item of data or the time by which one item of data is delayed, is expressed as a "unit of time" below. By deciding the delay amount in this way, as shown diagrammatically in FIG. 6 described below, adjustment is performed so that the head of the parity data appears after the tail-end of the main data, consecutively as regards writing timing. Moreover, the invention is not limited to the abovementioned example, and computation may be done using a value that can be adjusted so that writing to the storage apparatus is performed in a state in which the main data and the parity data are linked.

First, the head of the main data is inputted to the first delay element 370A, and is outputted to the second delay element 370B after been delayed by 1 unit of time only. Next, in the second delay element 370B, a delay of one unit of time is given, in the same way, and output to the next delay element 370 is performed. After that, sequentially, output is performed as far as the N-th delay element 370C, and the head data that has been delayed a total of N units of time is outputted from the delay unit 350. Here, data outside of the head data of the main data is inputted continuously to the delay element 370 in question and processing is performed the same as for the head data, each time the head data of the main data is outputted from the respective delay elements 370. Accordingly, after a number of units of time computed as (N+the number of items of data included in the main data), after the head of the main data is inputted to the first delay element 370A, all of the data included in the main data is outputted from the delay unit 350. As a result, the main data and the parity data appear in the writing circuit 334, so as to be linked, time-wise.

Figure 5:
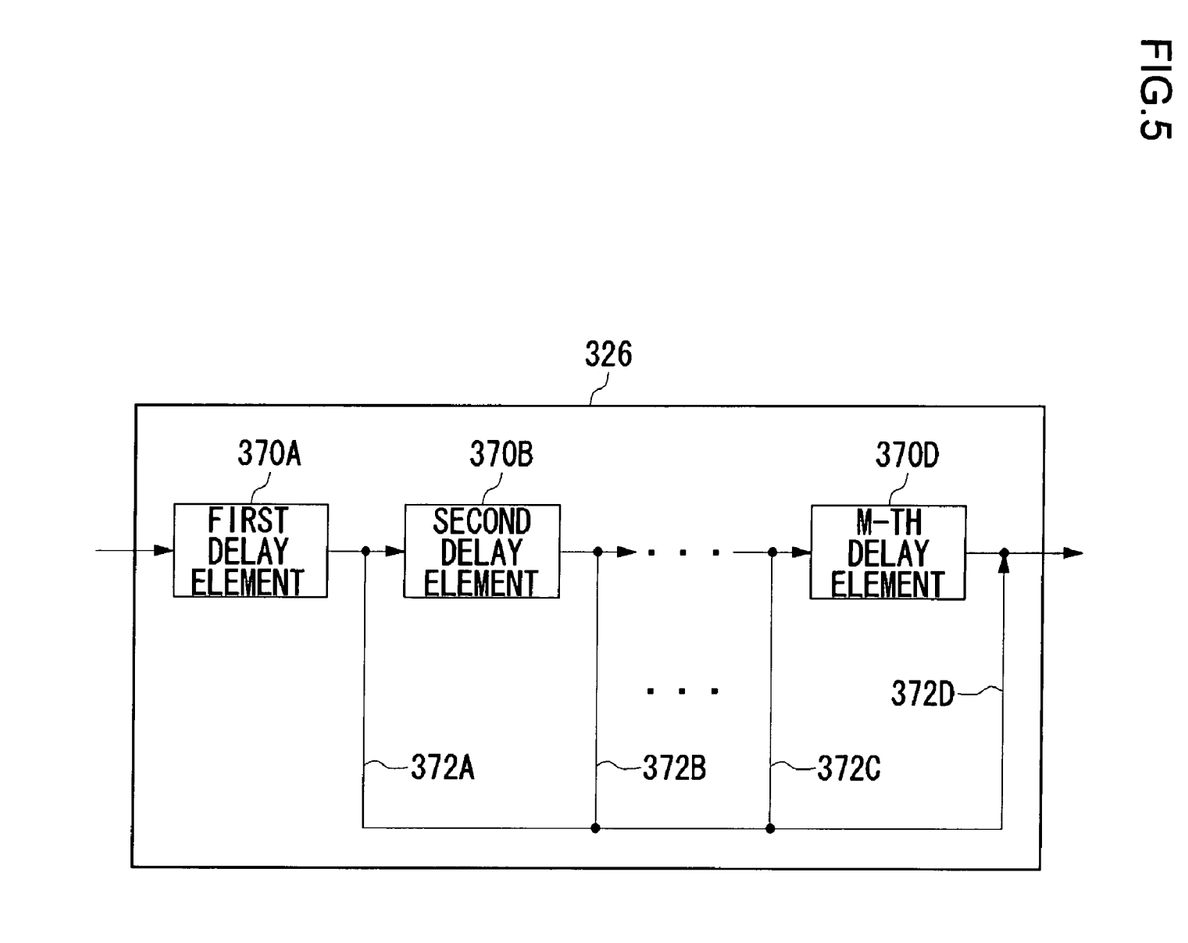
FIG. 5. is a view showing a second configuration example of the timing adjustment circuit of FIG. 3.

FIG. 5 is a view showing a second configuration example of a timing adjustment circuit 326 of FIG. 3. The second configuration example of the timing adjustment circuit 326 includes a first delay element 370A, a second delay element 370B, an M-th delay element 370D, and the like, representing delay elements 370. M is a positive integer larger than the N described above. In addition, output signals of the respective delay elements 370, excepting the M-th delay element 370D, pass a first signal line 372A, a second signal line 372B, and a third signal line 372C, representing signal lines 372, and are outputted, via a fourth signal line 372D, at a rear stage of the M-th delay element 370D. For portions that are common to the abovementioned embodiment, the same reference symbols are given, and explanations are simplified.

In the second configuration example of the timing adjustment circuit 326, it is necessary to provide more delay elements 370 than the delay amount N that is expected. The expected delay amount N may be a maximum value or the like, of data that is an object of LDPC encoding assumed in a system to which the LDPC encoder 304 is applied. After that, experiments and the like are performed, the delay amount N is confirmed, and, in order to obtain the desired delay amount N, trimming is performed by a laser with an LSI mask, with the exception of one signal line among the signal lines 372. The trimming by a laser with an LSI mask means burning off, by a laser, a signal line on the LSI mask, so that an electrical signal is not conducted. For example, in cases in which the delay amount N confirmed by experiment or the like, is 1, the signal lines 372, outside of the first signal line 372A, may be trimmed. In addition, in cases in which the delay amount is 2, the signal lines 372, outside of the second signal line 372B, may be trimmed. As a result, the second configuration example of the timing adjustment circuit 326 corresponds to the first configuration example of the timing adjustment circuit 326 diagrammatically shown in FIG. 4, and has a buffer feature with M delay elements 370, and timing adjustment of the main data can be performed so that the main data and the parity data are linked, time-wise.

By having this type of configuration, even in cases in which the delay amount cannot be decided in advance, it is possible to realize the timing adjustment circuit 326 in which the delay amount can be flexibly changed. In other words, the second configuration example can be said to be the timing adjustment circuit 326 in which the delay amount is variable. With regard to design and mounting of the actual LDPC encoder 304, there are cases in which the delay time for the parity generation circuit 328 is not decided until mounting on a semiconductor board, by an LSI mounting procedure or the like. In these types of cases, the present configuration example is preferable.

Figure 6:
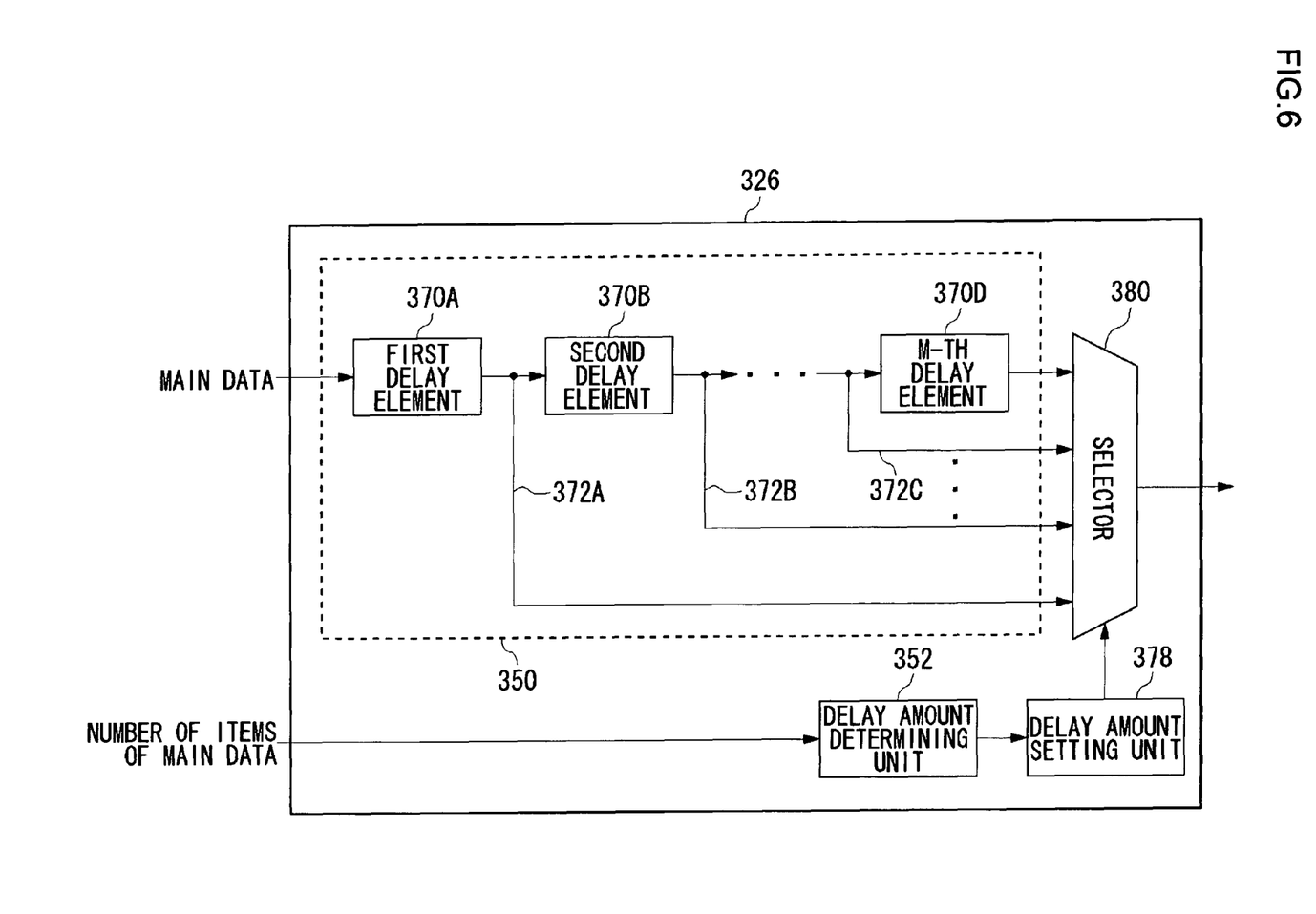
FIG. 6. is a view showing a third configuration example of the timing adjustment circuit of FIG. 3.

FIG. 6 is a view showing a third configuration example of a timing adjustment circuit 326 of FIG. 3. The configuration example of the timing adjustment circuit 326 includes: a delay unit 350 for delaying and outputting the main data that has been inputted, a delay amount determining unit 352 for determining the delay amount based on the number of items of the main data, a delay amount setting unit 378 for setting the delay amount and instructing a selector 380, based on the delay amount decided by the delay amount determining unit 352, and the selector 380 for selecting and outputting any signal outputted from the delay unit 350, based on the instruction of the delay setting unit 378. The third configuration example of the timing adjustment circuit 326 differs from the configuration example shown in FIG. 4 and FIG. 5, and has a configuration in which the delay amount can be changed adaptably. For portions that are common to the abovementioned embodiment, the same reference symbols are given, and explanations are simplified.

The delay unit 350, as shown diagrammatically by a portion surrounded by a broken line, includes a first delay element 370A, a second delay element 370B, an M-th delay element 370D, and the like, representative of delay elements 370; the respective delay elements 370 cause a delay to inputted signals and output them to the delay elements 370 of a rear stage, in addition to outputting to the selector 380. The respective delay elements 370 sequentially accumulate the main data that is inputted, and output this data after giving it a delay of 1 unit of time. Here, M is a positive integer with a value larger than the delay amount N. Furthermore, the delay unit 350 may, for example, be configured to include a buffer temporarily holding inputted data, and may include a configuration having a shift register and the like, configured from a flip-flop circuit.

The selector 380 selects and outputs any output signal among output signals of the respective delay elements 370, that have been inputted, based on an instruction from the delay amount setting unit 378 described below. The selected output signals continue to be selected, if the instruction from the delay amount setting unit 378 does not change. In other words, if the instruction from the delay amount setting unit 378 does not change, output is done after applying delays of a fixed delay amount. Accordingly, as long as the instruction from the delay amount setting unit 378 does not change, similar to the timing adjustment circuit 326 shown in FIG. 4 and FIG. 5, it can be said that there is a function for giving a constant delay to the main data by a fixed delay amount.

The delay amount determining unit 352 is a circuit for determining the delay amount in order to adjust the timing of the main data. The delay amount may be generated by a method described above or the like, giving consideration to the time required to generate the parity data in the parity generation circuit 328, so as to cancel out the delay time in the parity generation circuit 328 shown in FIG. 3. The delay amount determining unit 352 performs computation of the delay amount every time the number of items of the main data changes, and gives notification to the delay amount setting unit 378.

Here, the delay amount has a much smaller value, compared to the number of data items included in the main data. As described above, the delay amount is the processing time in the parity generation circuit 328 (abbreviated to "parity generation time" below), reduced by the number of data items (abbreviated to "data number" below) included in the main data. Here, in order that the delay amount has a value smaller than the data number, a relationship shown in Equation (6) is required.

$$\text{parity generation time} - \text{data number} < \text{data number} \qquad \text{Equation (6)}$$

Here, if Equation (6) is modified, Equation (7) is obtained.

$$\text{parity generation time} < 2 \times \text{data number} \qquad \text{Equation (7)}$$

In order to satisfy Equation (7), the parity generation time must be within twice the data number. Here, considering the generation processing in the parity generation circuit 328, the parity generation circuit 328 does not begin processing after all the data included in the main data has been inputted, but rather begins processing immediately after the head of the main data has been inputted. The next data, after the head of the main data, is inputted, and subsequently, parity generation takes place in the inputted order. This parity generation is done with respect to the first interleaver 330, the multipliers 340, and the first de-interleaver 332, described above, and it will be clear to one skilled in the art that this is carried out in a processing time less than the data number. The reason for this is because, on the one hand, the data number for the storage apparatus of the prescribed embodiment has a value of from several thousand to several tens of thousands, and the parity generation can normally be completed in a few units of time. Accordingly, the parity generation time is the data number+α (α being a value greater than or equal to 1 and less than the data number). In this way, Equation (7) is satisfied. Normally, since α has a value smaller than the data number, the delay amount has a much lower value than the number of items of data included in the main data.

The delay amount setting unit 378 instructs the selector 380 to select and output one output signal among signals delayed by the respective delay elements 370, based on the delay amount determined by the delay amount determining unit 352. In other words, the delay amount setting unit 378 may give an instruction so that the main data is delayed by the delay amount determined by the delay amount determining unit 352, and is outputted from the selector 380. For example, in cases in which the delay amount N determined by the delay amount determining unit 352 is 2, in order for an output signal of the second delay element 370B to be outputted, the delay amount setting unit 378 may arrange that the second signal line 372B is selected. Furthermore, in cases in which the delay amount N is (M−1), in order for an output signal of a delay element 370 of a forward stage of the M-th delay element 370D to be outputted, the delay amount setting unit 378 may arrange that the third signal line 372C is selected.

By having this type of configuration, the main data can be delayed by the delay amount N only. In addition, by causing the delay, the timing is adjusted, and in the writing circuit 334, the head of the parity data can be outputted after the tail-end data of the main data, giving a state in which both are linked. Furthermore, even in cases in which the number of items of data, that is an object for encoding in the LDPC encoder 304, is adaptably changed, by adaptably changing the delay amount each time the number of items of data changes, adjustment of the timing of the main data can be done. For example, in cases in which the LDPC encoder 304 is applied to a mobile terminal, the number of items of data that is an object of encoding by the LDPC encoder 304 is variable, according to data which is communicated; however, even in these types of cases, since the delay amount can be adaptably varied for each item of data which is communicated, the third configuration of the timing adjustment circuit 326 is a preferred example.

Figure 7:
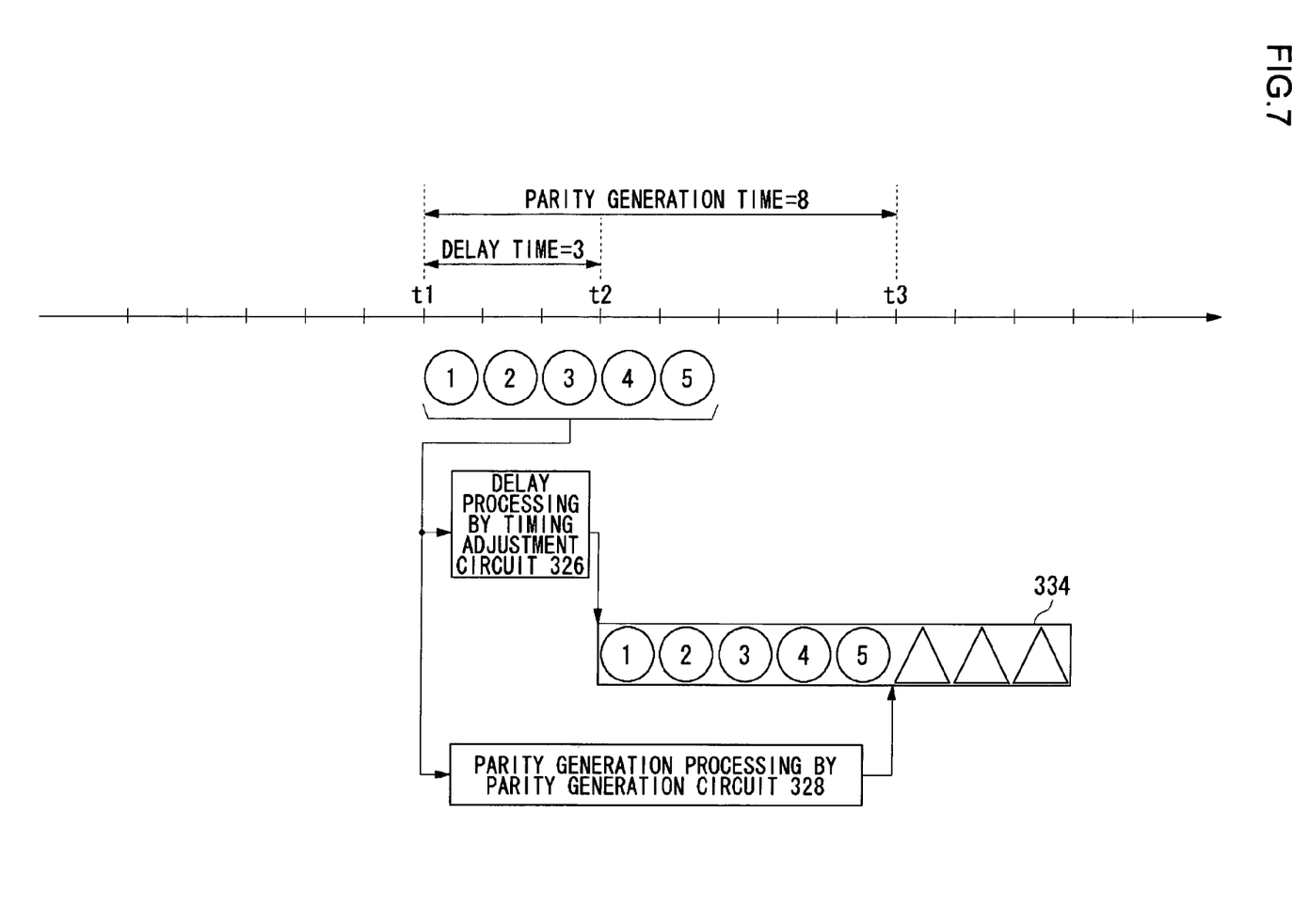
FIG. 7 is a view showing a timing chart example showing operation of a parity generation circuit and the timing adjustment circuit of FIG. 3.

FIG. 7 is a figure showing an example of a timing chart showing operations of the timing adjustment circuit 326 and the parity generation circuit 328 of FIG. 3. In order to facilitate understanding of the present invention, the timing chart of FIG. 7 is a view visually showing a state in which the main data and the parity data are sequentially written to the writing circuit 334. In FIG. 7, respective items of data included in the main data are expressed by a circle (○), and respective items of data included in the parity data are expressed by a triangle (Δ). A numerical value written in the circle shows a sequence in which the main data is inputted to the timing adjustment circuit 326, or a sequence in which the main data is outputted. With regard to the respective items of the main data that have been given delay processing by the timing adjustment circuit 326, and the main data outputted from the timing adjustment circuit 326 to the writing circuit 334, the numbers written in the circles correspond to identical respective data items. In addition, by writing the circle (○) and the triangle (Δ) in a block indicating the writing circuit 334 shown in FIG. 7, the timing at which the main data or the parity data is inputted to the writing circuit 334 is made clear. Furthermore, in actual processing, the writing circuit 334 begins writing to the storage apparatus via a circuit in the rear stage, each time the data is written, and this is diagrammatically shown for convenience as in FIG. 7, in order to visually express the fact that the main data and the parity data are linked.

Here, it is assumed that the number of data items included in the main data is 5, and that the number of data items included in the parity data is 3. Furthermore, the parity data generation time in the parity generation circuit 328 is taken as 8 units of time, and the delay amount in the timing adjustment circuit 326 is taken as 3 units of time.

First, at time t1, a first item of data of the main data is inputted sequentially from the head of the respective main data to the timing adjustment circuit 326 and the parity generation circuit 328, respectively. Next, the main data is delayed by 3 units of time only, that is the delay amount, from the time t1 to time t2, by the timing adjustment circuit 326. Furthermore, at the time t2, writing to the writing circuit 334 is begun, and writing is done sequentially until the tail-end of the main data. In the same way, a second item of data of the main data is inputted to the timing adjustment circuit 326 at timing of (t1+1), and 3 units of time later, at time (t1+4), is inputted to the writing circuit 334. After that, in the same way, writing to the timing adjustment circuit 326 and the writing circuit 334 is carried out sequentially. On the other hand, at time t1 the main data is inputted from the head thereof, sequentially to the parity generation circuit 328. Then, 8 units of time later at time t3, the head of the parity data is outputted to the writing circuit 334. After that, all the data included in the parity data is written sequentially. As a result, as shown diagrammatically in the block of the writing circuit 334, the main data and the parity data are in a state in which they are written consecutively, time-wise.

By this type of embodiment, writing is performed to the storage apparatus in a state in which the main data and the parity data are linked, without carrying out the handshake. As a result, even if the capacity of the storage apparatus is increased, hardware size is not enlarged, and it is possible to provide the storage apparatus in which effects on realizing high speed can be reduced.

Above, according to the present embodiment, the head of the generated parity data can be made to appear in the writing circuit 334 after the tail-end of the main data, consecutively as regards timing of writing, by adjusting the timing of the main data, so as to cancel out the delay time in the parity generation circuit 328. Furthermore, the main data and the parity data are not separated, but can be written to the storage apparatus in a state in which both are linked. Moreover, by arranging the timing adjustment circuit 326 in a processing path of the main data, excess load is not given to the parity generation circuit 328, and the main data and the parity data can be accurately linked. In addition, it is possible to shorten the writing time to the storage apparatus. Furthermore, with a value for which time required for generating the parity data is considered, by delaying the main data, the main data and the parity data can be written to the storage apparatus with good timing. In addition, by arranging the number of the delay elements 370 to correspond to the delay amount, timing adjustment can be performed autonomously, without the need for the software-type of handshake control. Since it is not necessary to install extra hardware, implementation can be realized on a small sized semiconductor integrated circuit. Moreover, access control to the storage system can be realized at a higher speed.

In the present embodiment, an explanation has been given in which the delay amount is computed by subtracting the length of the main data from the processing time in the parity generation circuit 328. However, there is no limitation thereto, and a delay amount computed in advance may be retained and used according to needs. Moreover, in the third configuration example of the timing adjustment circuit 326, an explanation has been given in which the delay amount is determined by the delay amount determining unit 352 as needed. However, there is no limitation thereto, and a delay amount generated in advance may be fixed with software, and may be set by the delay amount setting unit 378 each time the system starts up. Furthermore, the delay amount may be fixed with hardware, by a power supply or by GND. Even in these cases, the abovementioned effects can be obtained.

The present invention has been explained above, based on the embodiments. These embodiments are examples, and it will be understood by one skilled in the art that combinations of the embodiments, or various modified examples of combinations of the various component elements and various processes thereof are possible and that these modified examples are also within the scope of the present invention.

What is claimed is:

1. A data writing apparatus for writing main data and parity data used for error correction of the main data, to a storage apparatus, the data writing apparatus comprising:
    a writing circuit for writing the main data and the parity data to the storage apparatus;
    a parity generation circuit for generating the parity data in parallel with writing of the main data; and
    a timing adjustment circuit for performing adjustment so that a head of the generated parity data appears after a tail-end of the main data, consecutively, as regards timing of writing; wherein
    the main data and the parity data, whose timing is adjusted by the timing adjustment circuit, are provided to the writing circuit;
    wherein the timing adjustment circuit delays the main data, with, as a delay amount, a value obtained by subtracting, from time required for generation of the parity data in the parity generation circuit, time required for supplying data from the head to the tail-end of the main data, to the writing circuit.

2. A data writing apparatus according to claim 1, wherein the parity generation circuit comprises:
- an interleaving circuit for sorting an order of the main data in accordance with a prescribed rule;
- a low density parity check encoding circuit for performing low density parity check encoding on data sorted by the interleaving circuit, and for generating encoded data; and
- a de-interleaving circuit for returning an order of the encoded data generated by the low density parity check encoding circuit, to an original form, and for outputting the parity data.

3. A data writing apparatus according to claim 1, wherein the timing adjustment circuit is arranged in a propagation path of the main data so as to cancel out delay time in the parity generation circuit.

4. A data writing apparatus according to claim 1, wherein the timing adjustment circuit comprises: a delay amount determining unit for determining a delay amount, and, using the delay amount supplied from the delay amount determining unit, delays and outputs the main data inputted to the timing adjustment circuit.

5. A data writing apparatus according to claim 1, wherein the timing adjustment circuit comprises a number of delay elements, the number corresponding to the delay amount, and a delay element thereof delays, by the delay amount only, and outputs the main data inputted to the delay element.

6. A data writing apparatus according to claim 1, wherein the timing adjustment circuit comprises:
- a delay amount determining unit for determining the delay amount; and
- a plurality of delay elements to which the main data is inputted, delayed, and outputted;
- wherein,
  - based on the delay amount determined by the delay amount determining unit, any delay element among the plurality of delay elements is selected, and the main data is outputted from the selected delay element, sequentially to the writing circuit.

7. A data writing apparatus according to claim 6, wherein the plurality of delay elements comprise at least more delay amounts than the delay amount.

8. A data writing apparatus according to claim 1, wherein the storage apparatus is a magnetic storage apparatus built-in in a computer; the parity generation circuit generates the parity data for the main data generated inside the computer; and the writing circuit writes the main data and the parity data sequentially to the magnetic storage apparatus.

9. A data writing apparatus according to claim 1, wherein the apparatus is integrated on one semiconductor board.

10. A storage system, having a signal storage system comprising a write channel for writing data to a storage apparatus, and a read channel for reading data stored in the storage apparatus, wherein the write channel comprises:
- a first encoder for run-length encoding of data;
  - a second encoder for encoding data encoded by the first encoder, using
- a low density parity check code; and
  - a data writing unit for writing the data encoded by the second encoder, to the storage apparatus;
- the read channel comprises:
  - a data reading unit for reading the data stored in the storage apparatus;
  - a soft output detection unit for calculating likelihood for the data read by the data reading unit and outputting a soft decision value;
  - a first decoder, corresponding to the second encoder, for decoding data outputted from the soft output detection unit; and
  - a second decoder, corresponding to the first encoder, for decoding the data decoded by the first decoder; and
- the data writing unit comprises:
  - a writing circuit for writing data encoded by the first encoder and parity data to the storage apparatus;
  - a parity generation circuit for generating the parity data in parallel with writing the data encoded by the first encoder; and
  - a timing adjustment circuit for performing an adjustment so that a head of the generated parity data appears after a tail-end of the main data, consecutively, as regards timing of writing; wherein
  - the main data and the parity data, whose timing is adjusted by the timing adjustment circuit, are provided to the writing circuit; and
  - wherein the timing adjustment circuit delays the main data, with, as a delay amount, a value obtained by subtracting, from time required for generation of the parity data in the parity generation circuit, time required for supplying data from the head to the tail-end of the main data, to the writing circuit.

* * * * *